(12) United States Patent
Koch et al.

(10) Patent No.: US 9,322,996 B2
(45) Date of Patent: Apr. 26, 2016

(54) SIMULTANEOUS PROCESSING OF MULTIPLE PHOTONIC DEVICE LAYERS

(71) Applicant: Aurrion, Inc., Goleta, CA (US)

(72) Inventors: Brian Koch, San Carlos, CA (US); Erik Norberg, Santa Barbara, CA (US); Alexander W. Fang, Goleta, CA (US); Jae Shin, Goleta, CA (US); Gregory Alan Fish, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 142 days.

(21) Appl. No.: 13/789,440

(22) Filed: Mar. 7, 2013

(65) Prior Publication Data

US 2014/0254978 A1    Sep. 11, 2014

(51) Int. Cl.
| | | |
|---|---|---|
| *H01L 21/822* | (2006.01) | |
| *G02B 6/13* | (2006.01) | |
| *G02B 6/12* | (2006.01) | |
| *G02F 1/00* | (2006.01) | |
| *G02F 1/21* | (2006.01) | |

(52) U.S. Cl.
CPC .. *G02B 6/13* (2013.01); *G02B 6/12* (2013.01); *G02B 6/12004* (2013.01); *G02F 1/0018* (2013.01); *H01L 21/822* (2013.01); *G02F 2001/212* (2013.01)

(58) Field of Classification Search
CPC ........ G02B 6/13; G02B 6/12; G02B 6/12004; H01L 21/822
USPC ................... 385/14, 129–132; 438/23, 24, 31
See application file for complete search history.

(56) References Cited

U.S. PATENT DOCUMENTS

| | | | |
|---|---|---|---|
| 5,159,699 A | 10/1992 | de Monts | |
| 6,870,992 B2 | 3/2005 | Grosjean et al. | |
| 6,987,913 B2 | 1/2006 | Blauvelt et al. | |
| 7,050,681 B2 | 5/2006 | Blauvelt et al. | |
| 7,095,920 B1 | 8/2006 | Little | |
| 8,213,751 B1* | 7/2012 | Ho et al. | 385/14 |
| 8,676,002 B2 | 3/2014 | Grenouillet et al. | |

(Continued)

FOREIGN PATENT DOCUMENTS

| | | |
|---|---|---|
| EP | 2463694 | 6/2012 |
| EP | 2463694 A1 | 6/2012 |

(Continued)

OTHER PUBLICATIONS

Extended European Search Report for European Patent Application No. 14000807.9, mailed Jun. 16, 2014, 6 pages.

(Continued)

*Primary Examiner* — Daniel Petkovsek
(74) *Attorney, Agent, or Firm* — Schwegman Lundberg & Woessner, P.A.

(57) ABSTRACT

Embodiments of the invention describe photonic integrated circuits (PICs) formed using simultaneous fabrication operations performed on photonic device layers. Each device of a PIC may be made from different optimized materials by growing the materials separately, cutting pieces of the different materials and bonding these pieces to a shared wafer. Embodiments of the invention bond photonic device layers so that shared (i.e., common) processing operations may be utilized to make more than one device simultaneously. Embodiments of the invention allow for simpler, more cost effective fabrication of PICs and improve photonic device performance and reliability.

17 Claims, 8 Drawing Sheets

(56) References Cited

U.S. PATENT DOCUMENTS

| | | | |
|---|---|---|---|
| 2005/0082531 A1* | 4/2005 | Rim | H01L 21/84 257/72 |
| 2009/0078963 A1* | 3/2009 | Khodja | 257/189 |
| 2009/0245316 A1 | 10/2009 | Sysak et al. | |
| 2012/0057816 A1 | 3/2012 | Krasulick et al. | |
| 2012/0063717 A1* | 3/2012 | Grenouillet et al. | 385/14 |

FOREIGN PATENT DOCUMENTS

| | | |
|---|---|---|
| WO | WO-03042734 | 5/2003 |
| WO | WO-03042734 A2 | 5/2003 |

OTHER PUBLICATIONS

Non-Final Office Action for U.S. Appl. No. 13/899,336, mailed May 5, 2014, 11 pages.

Ding, et al., Fabrication tolerant polarization splitter and rotator based on a tapered directional coupler, © 2012 Optical Society of America, Aug. 27, 2012 / vol. 20, No. 18 / Optics Express 20021, (Aug. 27, 2012), 7 pages.

Doerr, et al., Wide Bandwidth Silicon Nitride Grating Coupler, IEEE Photonics Technology Letters, vol. 22, No. 19, October 1, 2010, © 2010 IEEE, (Oct. 19, 2010), 3 pages.

Fan, et al., "High Directivity, Vertical Fiber-to-Chip Coupler with Anisotropically Radiating Grating Teeth," © 2007 Optical Society of America, © OSA 1-55752-834-9, (2007), 2 pages.

Ishii, et al., "SMT-Compatible Optical-I/O Chip Packaging for Chip-Level Optical Interconnects," (C)2001 IEEE, 2001 Electronic Components and Technology Conference, (2001), 6 pages.

Little, Brent E., et al., "Design Rules for Maximally Flat Wavelength-Insensitive Optical Power Dividers Using Mach—Zehnder Structures," IEEE Photonics Technology Letters, vol. 9, No. 12, Dec. 1997, IEEE 1997, (Dec. 12, 1997), pages.

Liu, Liu, et al., "Silicon-on-insulator polarization splitting and rotating device for polarization diversity circuits," © 2011 Optical Society of America, (C) 2011 OSA, Jun. 20, 2011 / vol. 19, No. 13 / Optics Express 12646, (Jun. 20, 2011), pp. 6.

Vermeulen, et al., "High-efficiency fiber-to-chip grating couplers realized using an advanced CMOS-compatible Silicon-On-Insulator platform," © 2010 Optical Society of America, (C) 2010 OSA, Aug. 16, 2010 / vol. 18, No. 17 / Optics Express 18278, (2010), 6 pgs.

"European Application Serial No. 14000807.9, Extended European Search Report mailed Jun. 16, 2014", 6 pgs.

* cited by examiner

US 9,322,996 B2

SIMULTANEOUS PROCESSING OF MULTIPLE PHOTONIC DEVICE LAYERS

FIELD

Embodiments of the invention generally pertain to photonic devices and more specifically to photonic integrated circuits comprising a plurality of photonic devices.

BACKGROUND

Photonic integrated circuits (PICs) that consist of multiple photonic devices offer many advantages over those that consist of discrete photonic devices, such as higher efficiency due to the removal of coupling losses between components, fewer packages and packaging steps, smaller size, and overall better performance; however, making each of said devices for these PICs usually requires the execution of many unique processing steps. Such involved and complicated processes are more expensive and tend to have lower yield, as each step incurs some yield loss in fabrication. This is a particular problem for PICs with a large number of components that all must work (in addition to the high number of processing steps). These PICs also tend to have a compromised performance for some or all of the components due to the need to choose a material and process that works for all of the devices that must be fabricated.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe photonic integrated circuits (PICs) formed using simultaneous fabrication operations performed on photonic device layers. Each device of a PIC may be made from different optimized materials by growing the materials separately, cutting (i.e., cleaving, etching, dicing) pieces of the different materials and bonding these pieces to a shared wafer. Embodiments of the invention bond photonic device layers so that shared (i.e., common) processing operations may be utilized to make more than one device simultaneously. Embodiments of the invention, as described below, allow for simpler, more cost effective fabrication of PICs and improve photonic device performance and reliability.

Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1A:
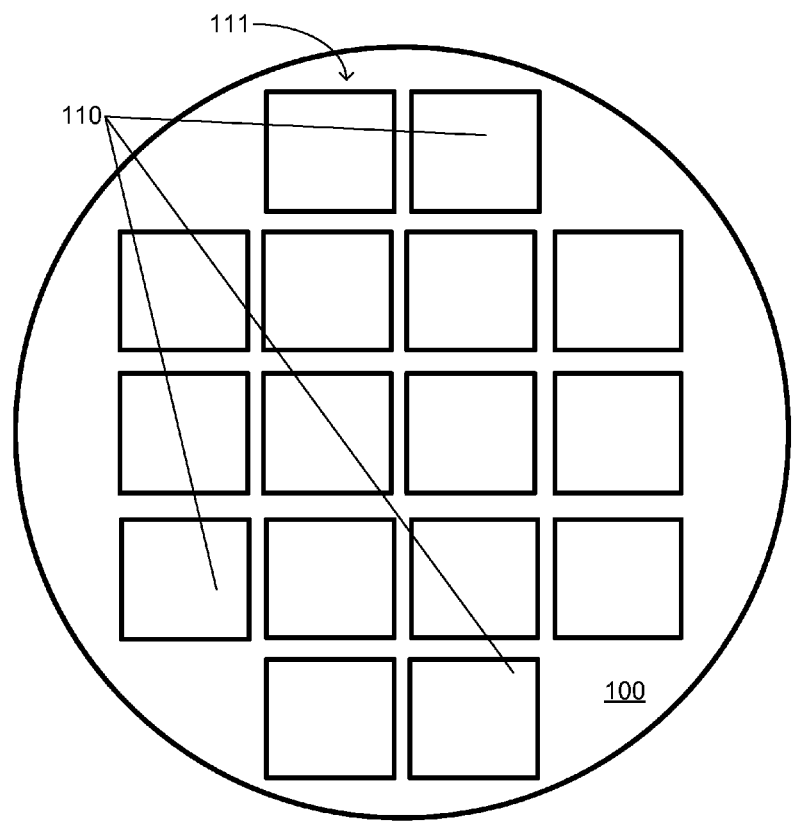
FIG. 1A-FIG. 1B are top-view and cross-sectional view illustrations of a shared wafer of a plurality of photonic integrated circuits according to an embodiment of the invention.
Figure 1B:
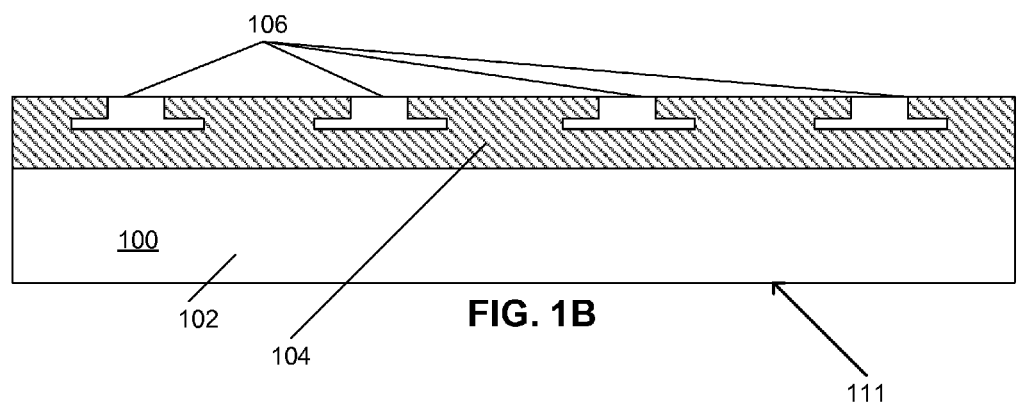

FIG. 1A-FIG. 1B are top-view and cross-sectional view illustrations of a shared wafer of for a plurality of PICs according to an embodiment of the invention. In this embodiment, wafer 100 is a wafer that is to subsequently (as described below) host additional material used to form some or all of the devices of the finished PICs. The locations of said PICs are shown as outlines 110 (including an outline for PIC 111, discussed below) in the top-view illustration of wafer 100 of FIG. 1A.

Wafer 100 may be processed to optically connect a plurality of devices or simply to act as a common carrier for them. In this embodiment, wafer 100 is shown in the cross-sectional view of the wafer illustrated in FIG. 1B to comprise a silicon on insulator (SOI) wafer including silicon substrate layer 102 and silicon dioxide ($SiO_2$) layer 104. In this example, the eventual location of PIC 111 on wafer 100 has been further patterned and processed to form optical waveguides 106 to optically connect the devices of the PIC. In some embodiments, wafer 100 further includes silicon nitride, silica or germanium as a waveguide layer in some part of PIC 111.

In other embodiments, instead of SOI wafer 100, embodiments of the invention may utilize a silica wafer as a common carrier for the devices of a PIC. The devices of the PIC may comprise the same device type with differing characteristics (e.g., lasers having differing lasing mediums), or different device types (e.g., a laser, a modulator and a photodetector).

In other embodiments, instead of or in addition to said waveguides, embodiments of the invention may include other passive or active components such as multimode interferometers, directional couplers, grating couplers, spot size converters, phase modulators, Mach-Zehnder modulators, and photodetectors.

Figure 2:
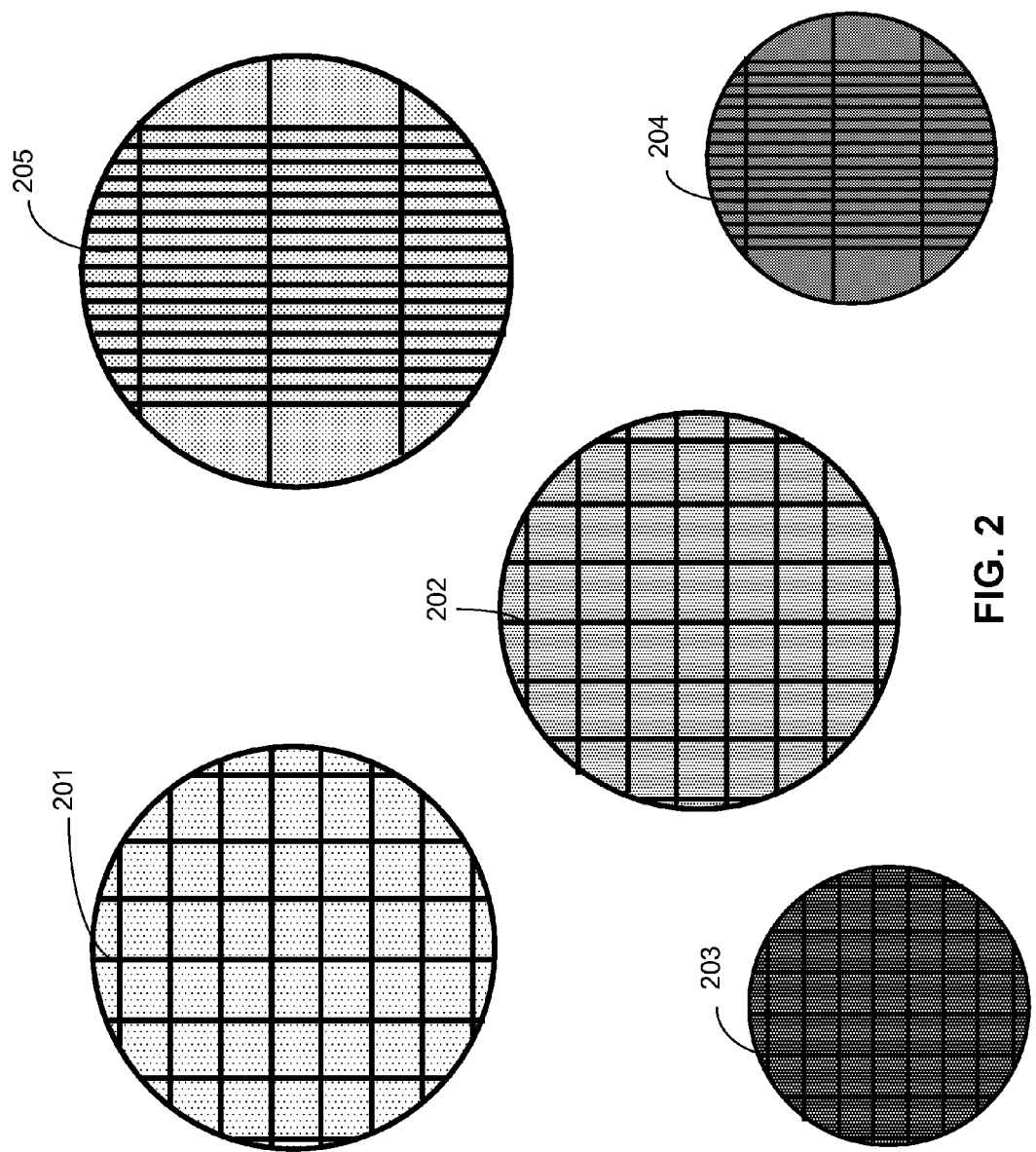
FIG. 2 is an illustration of a plurality of epitaxially-grown wafers for forming device components of a photonic integrated circuit according to an embodiment of the invention.

FIG. 2 is an illustration of a plurality of epitaxially-grown wafers for forming device components of a PIC according to an embodiment of the invention. Epitaxially-grown wafers (alternatively herein referred to as "epi wafers") 201, 202,

203, 204 and 205 comprise multiple epi materials optimized for different devices—e.g., lasers, modulators, and photodetectors. Said epi wafers may be grown separately using conventional methods. These wafers are to be separated (i.e., cleaved, etched, diced) into smaller pieces so that they may be bonded as device component layers to the same "shared" wafer of another material (e.g., wafer 100 of FIG. 1).

In this embodiment, epi wafers 201-205 may comprise different material than that of the shared wafer—e.g., heterogeneous devices wherein the shared wafer comprises silicon material and the epi wafers comprise III-V, magneto-optic or crystal substrate material. In other embodiments, at least one of epi wafers 201-205 may comprise the same material as the shared wafer.

Epi wafers 201-205 may be used to form device component layers for use in such devices as lasers of different wavelengths, gain peaks, gain bandwidth or other material parameters, electro-absorption modulators, also potentially of different wavelengths and material properties, photodetectors, also potentially of different wavelengths and material properties, optically nonlinear material elements, and optical isolators formed from magnetic materials.

When the materials for these components have been grown, those wafers may be cut into smaller pieces (if necessary). FIG. 2 illustrates an example of how wafers 201-205 may be cut as shown by the lines in each of the epi wafers. These pieces are bonded to the shared wafer together in various arrangements, in accordance with the placement of the components for the respective PIC design. These different pieces of epi wafers 201-205 may all be bonded to the shared wafer at the same time (or a subset of these pieces may be bonded to the shared wafer).

Figure 3A:
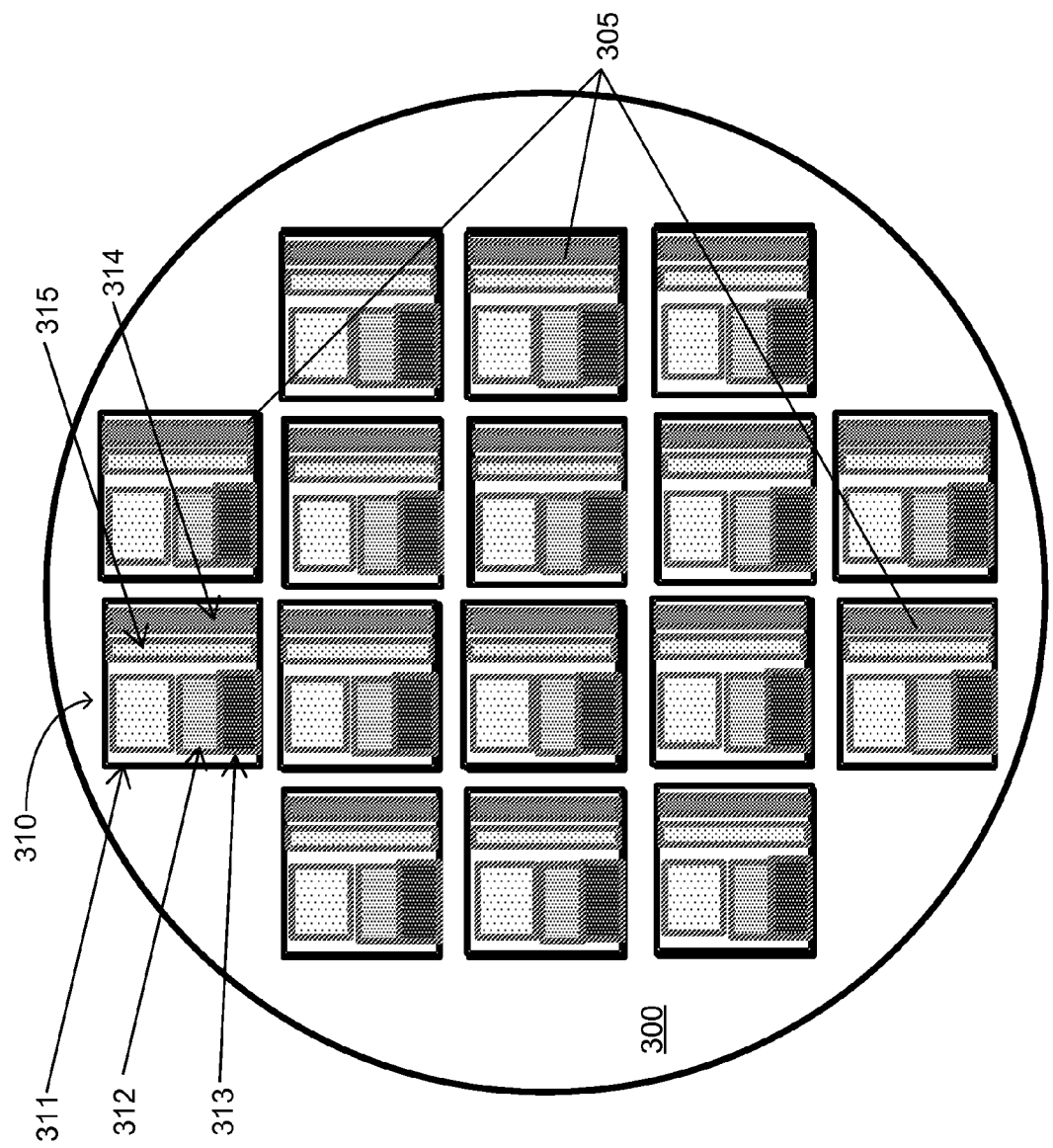
FIG. 3A-FIG. 3B are top view and cross-sectional view illustrations of multiple device component layers bonded to a shared wafer according to an embodiment of the invention.
Figure 3B:
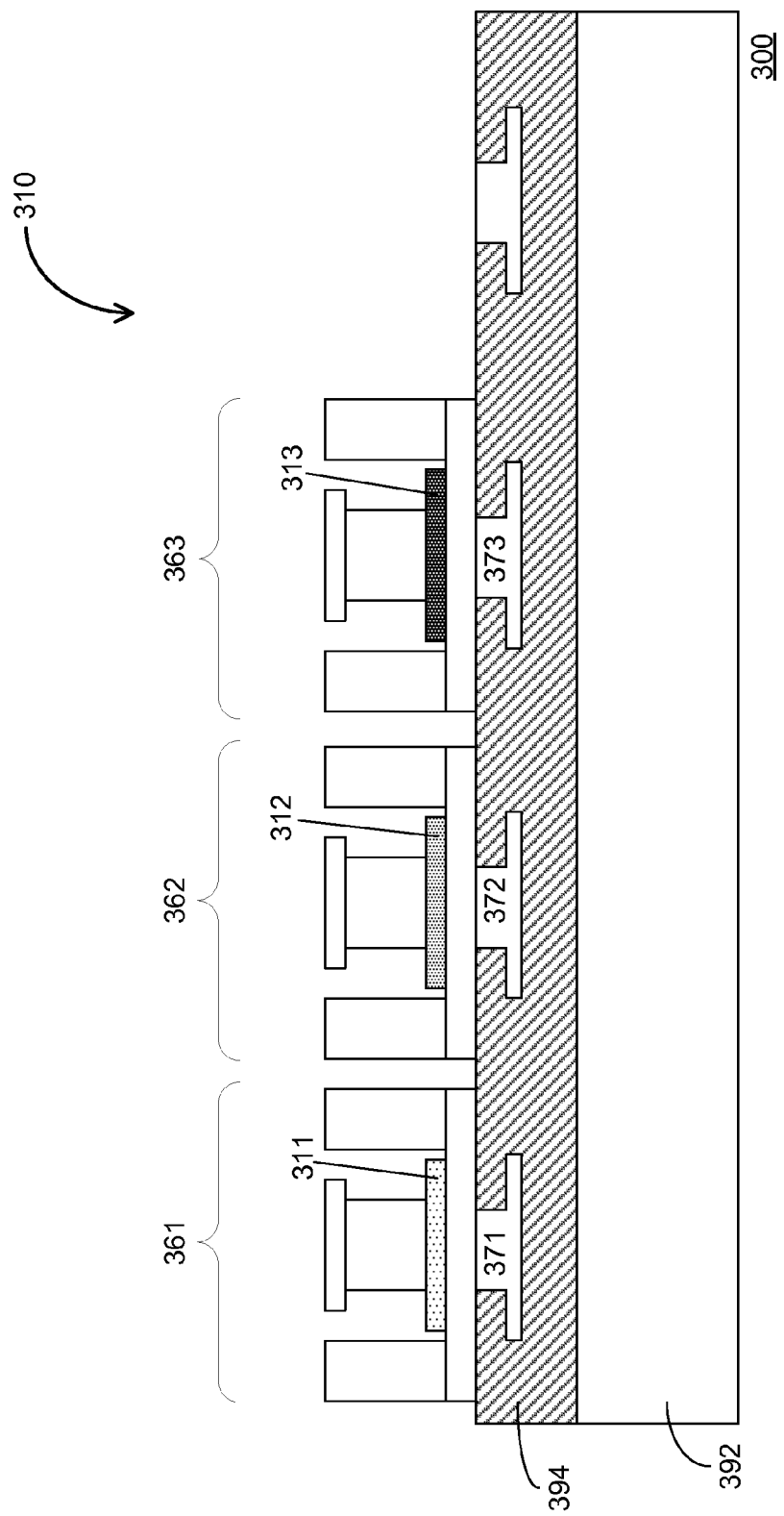

After all of these components are bonded to the surface, the shared wafer may then be treated as a single wafer (although now it has elements from many different wafers on it), and additional processing steps that are shared by all of the materials on the wafer may be executed. FIG. 3A-FIG. 3B are top view and cross-sectional view illustrations of multiple device component layers bonded to a shared wafer according to an embodiment of the invention. The top view of FIG. 3A illustrates epi wafer pieces bonded to a shared wafer for forming a plurality of PICs, and the cross-sectional view of FIG. 3B illustrates an example of the final structures that may be formed by simultaneous processing operations performed on the shared wafer and its bonded pieces.

In this embodiment, shared wafer 300 is shown in the top-view illustration of FIG. 3A to comprise PICs having multiple epi wafer components bonded to the locations of the PICs of the wafer (shown in FIG. 3A as PIC outlines 305, including an outline for PIC 310 discussed below).

Similar to FIG. 1 as described above, in this embodiment wafer 300 is shown in the cross-sectional view of the wafer in FIG. 3B to comprise an SOI wafer including silicon substrate layer 392 and $SiO_2$ layer 394, and has been further patterned and processed to form plurality of optical waveguides 371-374 to optically connect the devices of the PIC.

In this embodiment, the top-view illustration of wafer 300 shows that PIC 310 is to include epi wafer pieces 311, 312, 313, 314 and 315 (which, in this example, correspond to epi-wafers 201-205 of FIG. 2); the cross-sectional view of wafer 300 shows that PIC 310 includes a plurality of devices; device 361 formed, in part, by epi wafer piece 311 and waveguide 371, device 362 formed, in part, by epi wafer piece 312 and waveguide 372, and device 363 formed, in part, by epi wafer piece 313 and waveguide 373.

In this embodiment, because the epi wafer materials have been bonded to the shared wafer, processing steps may be selected so that the final components that form PIC 310 may be fabricated using many or all of the same processing steps. In other words, prior art solutions would require devices 361-363 to be formed serially; according to embodiments of the invention, devices 361-363 may be formed by selectively bonding materials to wafer 300 and performing processing operations to form the devices in parallel. These processing operations may include formation of waveguides in the bonded materials, wet etching of quantum wells in the bonded materials, deposition of metal contacts and probe pads, and other operations.

In some embodiments, the bonding process does not require precise alignment of the epi wafer materials because the processing operations carried out on the bonded material areas can be automatically aligned to previous steps that were carried out on the shared carrier wafer. Furthermore, the pieces of different epi materials may be bonded to different parts of the same die within the shared wafer such that each die on the shared wafer has multiple epi types on it, allowing for separate optimized devices to be formed on the same die and photonic circuit. In some embodiments, the bonded materials may each be oriented with respect to their component layout to allow for optimized component performance.

Figure 4A:
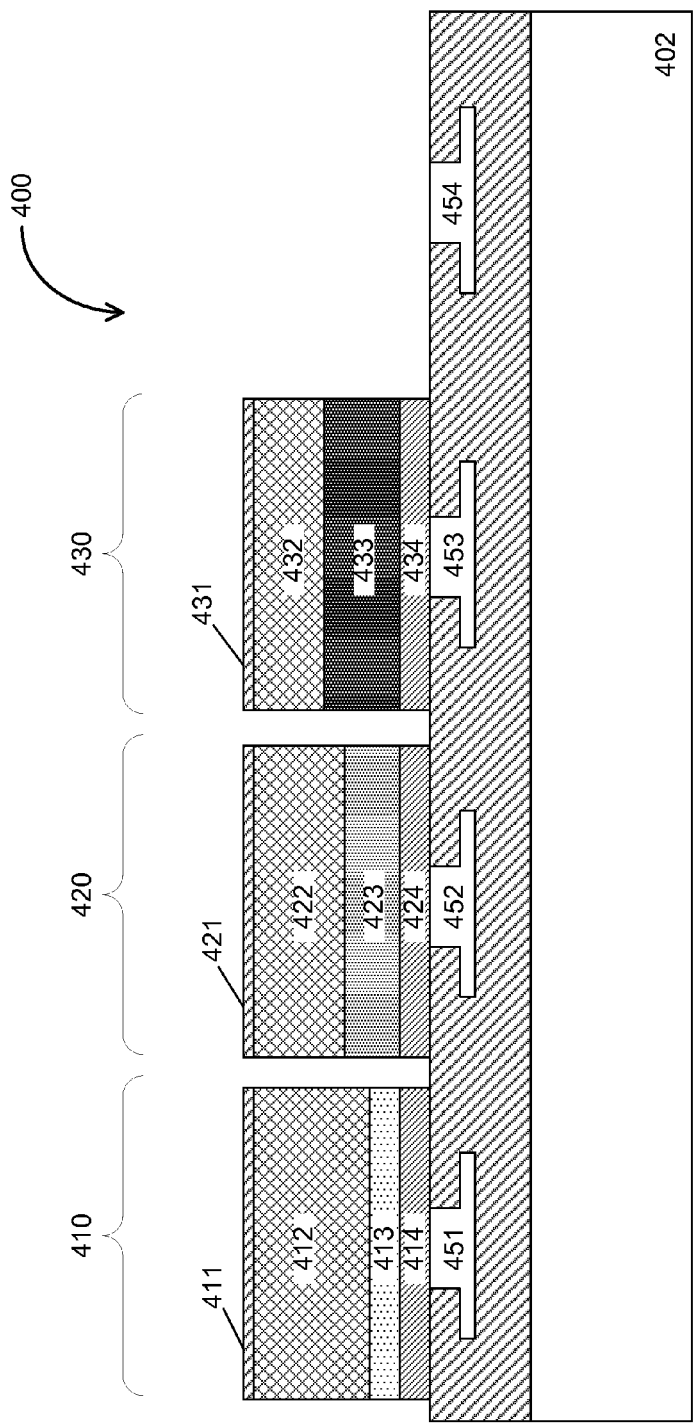
FIG. 4A-FIG. 4B illustrate a shared wafer having a plurality of bonded layers for forming a plurality of devices of a photonic integrated circuit according to an embodiment of the invention.
Figure 4B:
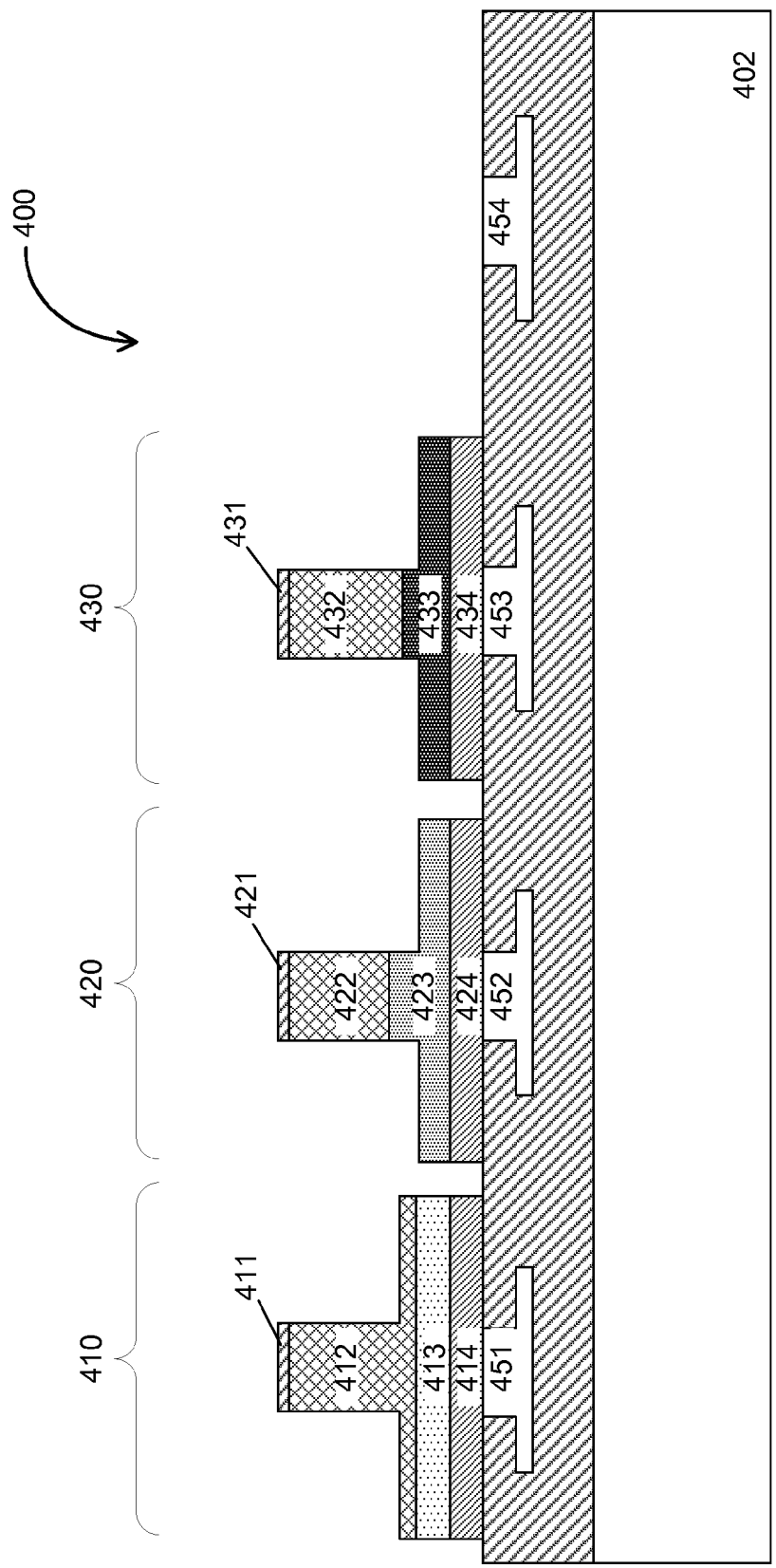

FIG. 4A-FIG. 4B illustrate a shared wafer having a plurality of bonded layers for forming a plurality of devices of a PIC according to an embodiment of the invention. In this embodiment, PIC 400 is shown to include SOI wafer 402 (including waveguides 451-454) having bonded material stacks 410, 420 and 430. Said bonded material stacks include a plurality of non-silicon device component layers as described below.

In this embodiment, bonded material stack 410 includes top contact layer 411, cladding layer 412, active layer 413 and bottom contact layer 414; bonded material stack 420 includes top contact layer 421, cladding layer 422, active layer 423 and bottom contact layer 424; and bonded material stack 430 includes top contact layer 431, cladding layer 432, active layer 433 and bottom contact layer 434.

Said active layers may comprise any materials/mediums having optical properties that may be modified by an applied electric field. Active layer mediums may differ based on their eventual device type—e.g., gain mediums for lasers, photodetection mediums for photodetectors, etc. Active layer mediums may also differ for common device types to function differently—e.g., lasing mediums having different emission wavelengths, different gain peak wavelengths, and different gain bandwidths, modulating mediums having different modulating wavelength ranges, photodetecting mediums having different detection wavelength ranges, etc.

In this embodiment, the total bonded material thicknesses of each photonic component layer are designed such that photolithography on all bonded material may be performed without significant resolution degradation. For example, the bonded materials' compositions and individual layer thicknesses (including said top contact, cladding, active and bottom contact layers of each stack) may be designed such that a combined single dry and etch operation may be used to simultaneously define various combinations of deep and surface type ridge structures (e.g., waveguide ridges) on the different bonded materials, as shown in FIG. 4B.

In this embodiment, bonded material stack 410 is shown in FIG. 4B such the combination of the top contact layer 411, cladding layer 412 (or both as a group) and active layer 413 has compositions and thicknesses to allow for a combined single dry-etch step which stops in cladding layer for surface ridge definition, and etches into the active layer for the remaining bonded material stacks—i.e., into active layers 423 and 433 of stacks 420 and 430, respectively. In other embodiments, the top contact and cladding layers of each bonded material stack may comprise a composition and thickness to allow for a combined single dry-etch step that stops above the active layer (for surface ridge definition) for all bonded material stacks, or stops in the active layer for all bonded material stacks. Furthermore, in some embodiments, the bottom contact layer of each bonded material stack has a composition and/or thickness to permit a combined single dry-etch step of all components and allow for some over-etch onto the shared wafer.

Figure 5:
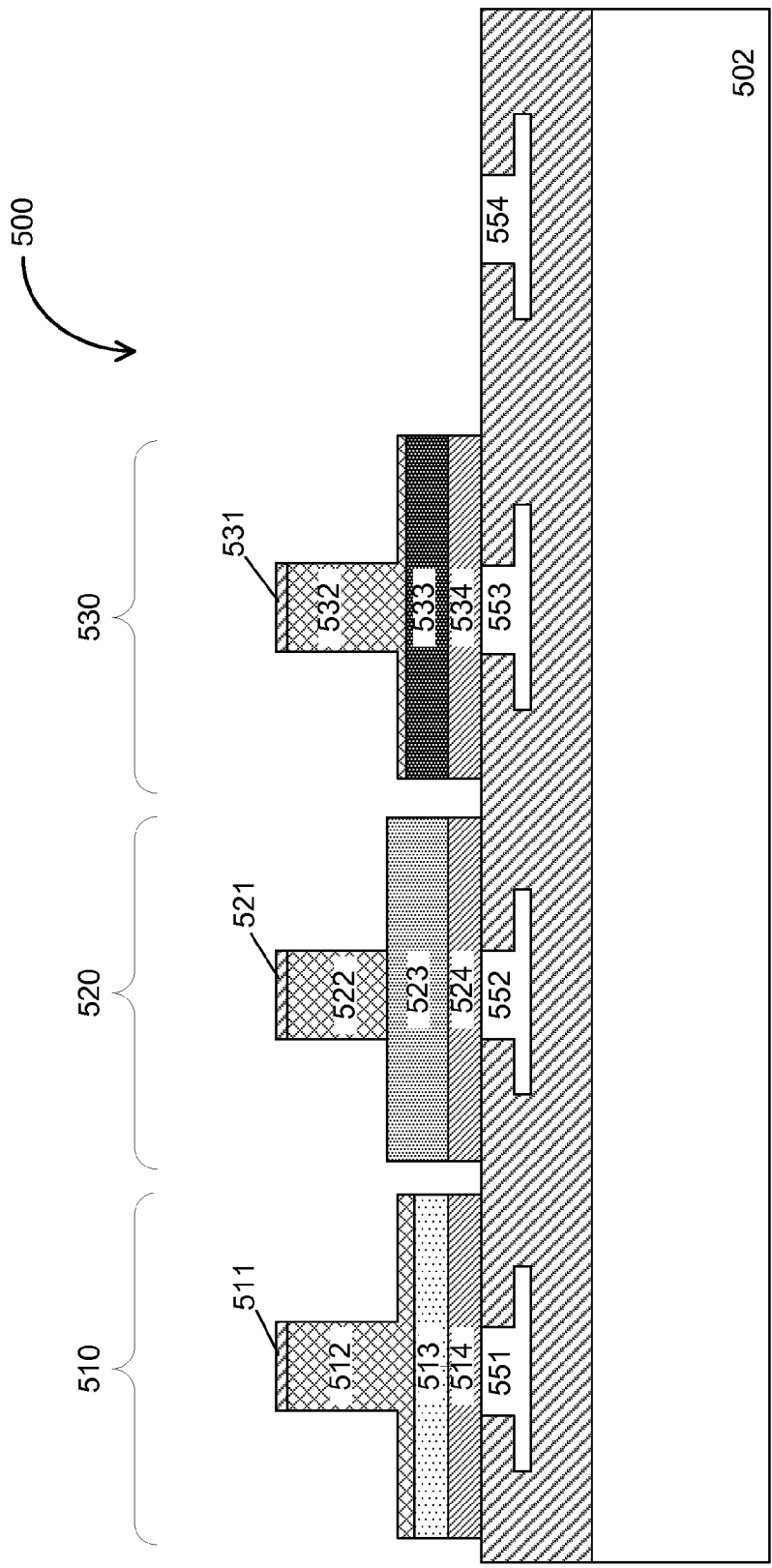
FIG. 5 is an illustration a shared wafer having a plurality of bonded layers for forming a plurality of devices of a photonic integrated circuit, including a layer further comprising an etch-stop layer, according to an embodiment of the invention.

In some embodiments, device layers may include an etch-stop layer so that, in the event a combined single dry and etch step is utilized, variations in surface structures on the different bonded materials may be formed. FIG. 5 illustrates an example of this embodiment. In this figure, PIC 500 is shown to include SOI wafer 502 (including waveguides 551-554) having bonded material stacks 510, 520 and 530. Said bonded material stacks include a plurality of device component layers as described below.

In this embodiment, bonded material stack 510 includes top contact layer 511, cladding layer 512, active layer 513 and bottom contact layer 514; bonded material stack 520 includes top contact layer 521, cladding layer 522, active layer 523 and bottom contact layer 524; and bonded material stack 530 includes top contact layer 531, cladding layer 532, active layer 533 and bottom contact layer 534.

In this embodiment, bonded material stacks 510 and 530 are each configured such that the combination of their respective top contact layers, cladding layers and active layers has compositions and/or thicknesses to allow for a combined single dry-etch step which stops at each of their respective cladding layers for surface ridge definition. However, active layer 523 includes an etch-stop layer, so that stack 520 does not comprise the same ridge structure/dimensions as stacks 510 and 530 when the simultaneous etch operation(s) is performed.

Figure 6:
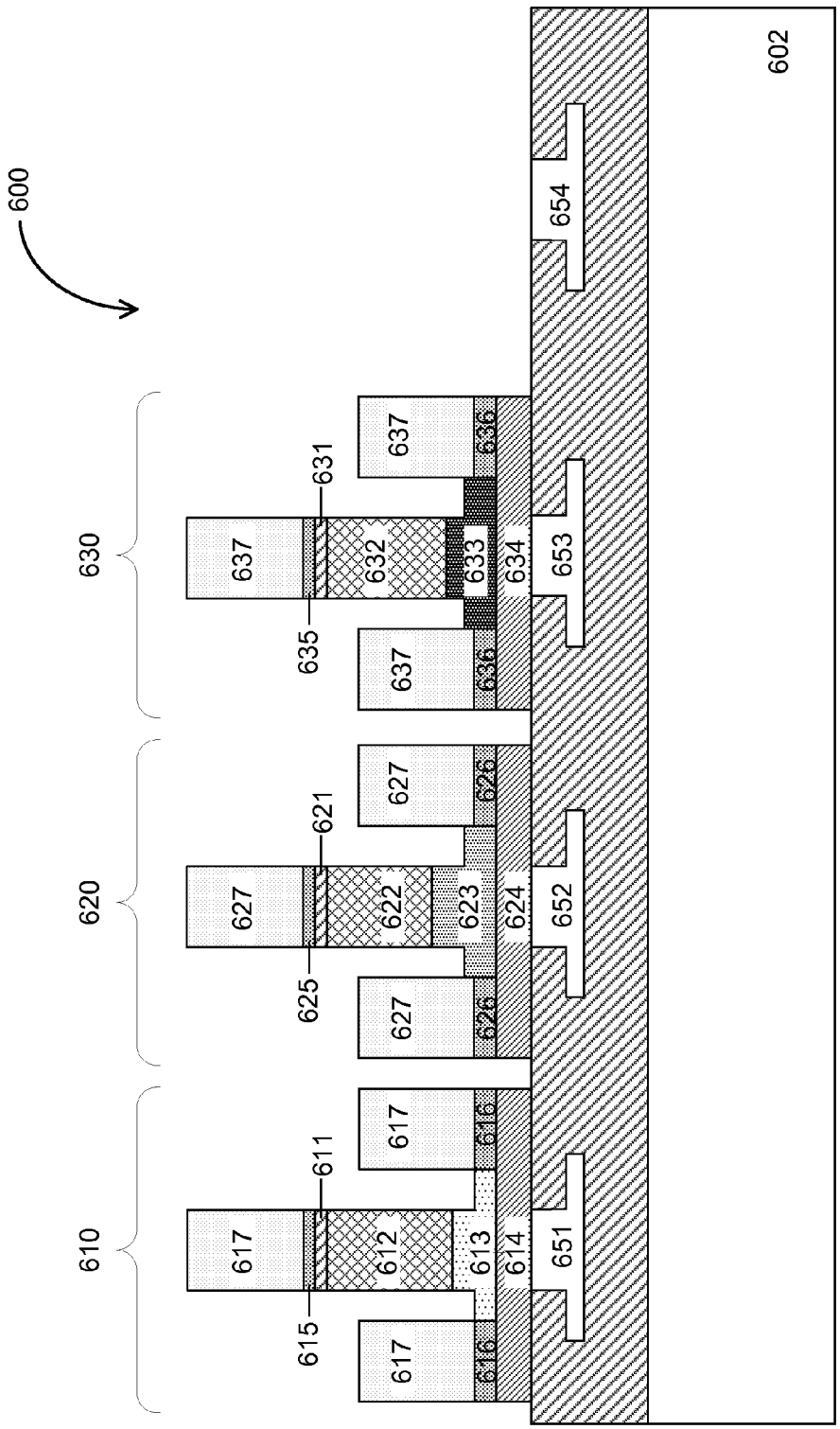
FIG. 6 is an illustration of a photonic integrated circuit comprising multiple photonic devices according to an embodiment of the invention.

FIG. 6 is an illustration of a PIC comprising multiple photonic devices according to an embodiment of the invention. In this embodiment, PIC 600 is shown to include SOI wafer 602 (including waveguides 651-654) having photonic devices 610, 620 and 630. In this example, device 610 is a laser, device 620 is a modulator and device 630 is a photodetector.

In this embodiment, laser 610 includes top contact layer 611, cladding layer 612, active layer 613, bottom contact layer 614, top contact metal 615, bottom contact metal 616 and probe metal 617; modulator 620 includes top contact layer 621, cladding layer 622, active layer 623, bottom contact layer 624, top contact metal 625, bottom contact metal 626 and probe metal 627; and photodetector 630 includes top contact layer 631, cladding layer 632, active layer 633, bottom contact layer 634, top contact metal 635, bottom contact metal 636 and probe metal 637.

The bottom contact metal layers of devices 610, 620 and 630 may have a composition and thickness such that a combined dry-etch may be utilized with some amount of tolerable over-etch onto the shared substrate wafer. The top contact metal layer for devices 610, 620 and 630 may have a similar or proper design such that the same contact metal(s) can be used to efficiently contact each of them. The bottom contact metal layer of the different materials may also have a similar or proper design such that the same contact metal(s) can be used to efficiently contact each of them.

The above described metal layers of devices 610, 620 and 630 may be processed simultaneously. In some embodiments, a combined single metallization operation is used for metal contacts of a device (e.g., p-contacts, n-contacts). The material composition of the different bonded materials may need to also be compatible with this common contact. In some embodiments, a combined single metallization operation is used for the probe metal contacts of the devices (i.e., probe metal contacts 617, 627 and 637), and possibly on the shared wafer as well. Because said metal layers are processed simultaneously in some embodiments, the heights of each of the plurality of photonic devices in a PIC may be the same and/or the contact metal layers of each device may each have the same alignment to the plurality of device waveguides. The contact metal layers may have the same misalignment offset (e.g., aligned to have a zero misalignment offset, misaligned and having the same horizontal, vertical or angular offset, etc.). In other words, metal layers for each heterogeneous devices have the same relative (mis)alignment in reference to the photo-lithographic mask used.

Embodiments of the invention effectively shift the need for re-growth or any other method of local epi optimization to a bonding operation. By starting with separate wafers that are each optimized for a different device, the difficulty of making different material regions from the same starting epi is avoided. Additionally, this process serves to combine processing operations for different components so that fewer operations are utilized. In other words, prior art solutions would require devices of a PIC to be formed serially; according to embodiments of the invention, devices of a PIC may be formed by selectively bonding materials to a shared/common wafer and performing processing operations to form the devices in parallel. Embodiments of the invention therefore significantly reduce manufacturing costs and time. Furthermore, the reduction of processing operations due to parallelization results in processes according to embodiments of the invention having higher yields compared to those of the prior art, and thereby increasing the reliability of devices of a PIC.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the invention may comprise SOI or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the invention, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may devices utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling linear electro optic coefficient, low transmission loss, and stable physical and chemical properties. Said crystal substrate materials may comprise, for example, lithium niobate (LiNbO3) or lithium tantalate (LiTaO3).

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. A method for forming a plurality of photonic heterogeneous devices on a shared silicon wafer substrate, including a first device and a second device, comprising:
    forming a plurality of silicon device components on a silicon semiconductor layer of the shared silicon wafer substrate for each of the plurality of heterogeneous devices;
    forming a plurality of non-silicon device component layers from a plurality of non-silicon semiconductor wafer substrates, wherein at least one non-silicon device component layer for the first device is included in a first non-silicon semiconductor wafer substrate, and at least one non-silicon device component layer for the second device is included in a second non-silicon semiconductor wafer substrate separate from the first non-silicon semiconductor substrate, and the second non-silicon device component layer comprises a different non-silicon material than the first non-silicon device component layer;
    bonding at least a portion of each of the plurality of the non-silicon semiconductor wafer substrates including their respective device component layers to the shared silicon wafer substrate, including bonding at least a portion of the first non-silicon semiconductor wafer substrate separate from at least a portion of the second non-silicon semiconductor wafer substrate;
    for each of the plurality of non-silicon semiconductor device component layers, removing portions of their respective non-silicon semiconductor wafer substrates; and
    performing a processing operation to process all of the plurality of bonded non-silicon semiconductor photonic component layers when forming the plurality of heterogeneous devices, including the first device and the second device.

2. The method of claim 1, wherein the plurality of silicon device components comprises a plurality of waveguides.

3. The method of claim 1, wherein each of the plurality of silicon device components comprises at least one of a multimode interferometer, a directional coupler, a grating coupler, a spot size converter, a phase modulator, a Mach-Zehnder modulator, or a photodetector.

4. The method of claim 1, wherein forming the plurality of non-silicon semiconductor device component layers comprises growing a plurality of non-silicon semiconductor layers on the plurality of non-silicon semiconductor wafer substrates, and
    wherein removing portions of the non-silicon semiconductor wafer substrates for each of the respective non-silicon semiconductor device component layers separating the plurality of non-silicon semiconductor layers from their respective non-silicon semiconductor wafer substrates prior to bonding the plurality of non-silicon semiconductor device component layers to the shared silicon wafer substrate.

5. The method of claim 1, wherein the plurality of heterogeneous devices each comprise the same photonic device type.

6. The method of claim 5, wherein the plurality of heterogeneous devices each comprise a heterogeneous photonic laser device, and the plurality of non-silicon semiconductor device component layers comprises lasing mediums each having at least one of different emission wavelengths, different gain peak wavelengths, and different gain bandwidths.

7. The method of claim 5, wherein the plurality of heterogeneous devices each comprise a heterogeneous photonic modulator, and the plurality of non-silicon semiconductor device component layers comprises modulating mediums each having different modulating wavelength ranges.

8. The method of claim 5, wherein the plurality of heterogeneous devices each comprise a heterogeneous photodetector, and the plurality of non-silicon semiconductor device component layers comprises photodetecting mediums each having different detection wavelength ranges.

9. The method of claim 1, wherein each of the plurality of heterogeneous photonic devices comprises a different photonic device type.

10. The method of claim 9, wherein the different photonic device types includes a laser, a modulator and a photodetector.

11. The method of claim 10, wherein the plurality of non-silicon semiconductor device component layers each comprises different active layer materials for the laser, the modulator and the photodetector.

12. The method of claim 1, wherein the processing operation to process all of the plurality of non-silicon semiconductor device component layers when forming the plurality of photonic devices comprises an etching operation, and wherein at least one of the plurality of non-silicon semiconductor photonic component layers includes an etch-stop layer.

13. The method of claim 1, wherein the non-silicon material comprises at least one of III-V material, magneto-optic material, or crystal substrate material.

14. The method of claim 1, wherein the processing operation comprises of a processing operations to simultaneously process all of the plurality of bonded non-silicon semiconductor photonic component layers when forming the plurality of heterogeneous devices.

15. The method of claim 14, wherein the processing operations to simultaneously process all of the plurality of bonded non-silicon semiconductor photonic component layers when forming the plurality of heterogeneous devices comprises a metal deposition processing operation for each of the plurality of heterogeneous devices.

16. The method of claim 1, wherein removing portions of the non-silicon semiconductor wafer substrates for each of the respective non-silicon semiconductor device component layers is performed prior to bonding at least a portion of each of the plurality of the non-silicon semiconductor wafer substrates including their respective device component layers to the silicon wafer substrate.

17. The method of claim 1, wherein removing portions of the non-silicon semiconductor wafer substrates for each of the respective non-silicon semiconductor device component layers is performed subsequent to bonding at least a portion of each of the plurality of the non-silicon semiconductor wafer substrates including their respective device component layers to the silicon wafer substrate.

* * * * *